(12) United States Patent
Hiyama et al.

(10) Patent No.: US 11,819,952 B2
(45) Date of Patent: Nov. 21, 2023

(54) SOLDERING APPARATUS AND METHOD OF DETECTING FAILURES OF GASKET

(71) Applicant: SENJU METAL INDUSTRY CO., LTD., Tokyo (JP)

(72) Inventors: Tsutomu Hiyama, Tokyo (JP); Nobuhiro Kojima, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 17/328,197

(22) Filed: May 24, 2021

(65) Prior Publication Data
US 2021/0402498 A1    Dec. 30, 2021

(30) Foreign Application Priority Data

Jun. 29, 2020    (JP) ................................ 2020-111315

(51) Int. Cl.
| | | |
|---|---|---|
| *B23K 3/08* | (2006.01) | |
| *B23K 3/04* | (2006.01) | |
| *G01M 3/30* | (2006.01) | |
| *B23K 101/42* | (2006.01) | |

(52) U.S. Cl.
CPC ................. *B23K 3/08* (2013.01); *B23K 3/04* (2013.01); *G01M 3/30* (2013.01); *B23K 2101/42* (2018.08)

(58) Field of Classification Search
None
See application file for complete search history.

(56) References Cited

U.S. PATENT DOCUMENTS

| | | | | |
|---|---|---|---|---|
| 5,364,007 A | * | 11/1994 | Jacobs | B23K 3/0646 219/390 |
| 5,573,174 A | * | 11/1996 | Pekol | H05K 3/3494 228/219 |
| 6,074,203 A | * | 6/2000 | Leturmy | G05D 11/138 432/47 |

(Continued)

FOREIGN PATENT DOCUMENTS

| | | |
|---|---|---|
| CN | 203629755 U | 6/2014 |
| CN | 105738047 A | 7/2016 |

(Continued)

OTHER PUBLICATIONS

Decision to Grant a Patent in corresponding Japanese Patent Application No. 2020-111315 (now Patent No. JP-6778880-B1), dated Sep. 10, 2020, with machine translation.

(Continued)

*Primary Examiner* — Devang R Patel
(74) *Attorney, Agent, or Firm* — Harness, Dickey & Pierce, P.L.C.

(57) ABSTRACT

Provided is a soldering apparatus including: a furnace body including a processing chamber in which boards are processed; a gasket provided at least to a part of the furnace body, and configured to seal the furnace body; a sealed space isolated from the processing chamber, and defined by the furnace body and the gasket; a gas supply apparatus configured to supply a first gas into the sealed space; and a measuring apparatus configured to measure one of pressure in the sealed space and concentration of a second gas in the sealed space.

14 Claims, 9 Drawing Sheets

(56) References Cited

U.S. PATENT DOCUMENTS

| | | | | |
|---|---|---|---|---|
| 2009/0001054 A1* | 1/2009 | Mizuno | ............... | H05K 3/3478 |
| | | | | 219/78.13 |
| 2009/0218386 A1* | 9/2009 | Kimbara | ............. | H05K 3/3494 |
| | | | | 228/103 |
| 2009/0275174 A1* | 11/2009 | Kimbara | ................. | B23K 3/08 |
| | | | | 438/121 |
| 2016/0339531 A1* | 11/2016 | Hiyama | ................ | B23K 1/008 |
| 2017/0282270 A1* | 10/2017 | Kagaya | ................ | F04B 49/065 |
| 2019/0277723 A1 | 9/2019 | Li | | |
| 2020/0269337 A1* | 8/2020 | Hiyama | ................ | F16J 15/025 |

FOREIGN PATENT DOCUMENTS

| | | | | | |
|---|---|---|---|---|---|
| CN | 108672878 | A | * | 10/2018 | |
| CN | 110153527 | A | * | 8/2019 | |
| JP | H05-073496 | A | | 3/1993 | |
| JP | H0685450 | A | | 3/1994 | |
| JP | 06344176 | A | * | 12/1994 | ............ B23K 31/02 |
| JP | H06-344176 | A | | 12/1994 | |
| JP | 07055345 | A | * | 3/1995 | |
| JP | H07-055345 | A | | 3/1995 | |
| JP | 2005-288497 | A | | 10/2005 | |
| JP | 2019-166532 | A | | 10/2019 | |
| JP | 2020-094765 | A | | 6/2020 | |
| JP | 2020-136626 | A | | 8/2020 | |

OTHER PUBLICATIONS

Extended European Search Report in European Patent Application No. 21173525.3, dated Nov. 5, 2021.

\* cited by examiner

SOLDERING APPARATUS AND METHOD OF DETECTING FAILURES OF GASKET

CROSS-REFERENCE TO RELATED APPLICATION

This application is based upon and claims benefit of priority from Japanese Patent Application No. 2020-111315 filed on Jun. 29, 2020, the entire contents of which are incorporated herein by reference.

TECHNICAL FIELD

The present invention relates to a soldering apparatus and a method of detecting failures of a gasket.

BACKGROUND ART

A reflow apparatus has been known as an example of apparatuses that solder electronic components to printed circuit boards. In the reflow apparatus, for ease of maintenance, a structure in which a housing of an upper furnace body is superimposed in a separable manner on a lower furnace body has been employed. A superimposed part of the furnace bodies is sealed with a gasket such that in-furnace air is prevented from leaking to the outside. By preventing the in-furnace air from leaking to the outside, in-furnace heating efficiency can be maintained. In addition, $N_2$ reflow apparatuses including furnaces in which a nitrogen atmosphere is maintained for increasing soldering efficiency also have been used. Also in the $N_2$ reflow apparatuses, the nitrogen atmosphere in the furnace can be maintained by preventing the in-furnace air from leaking to the outside. As an example of such reflow apparatuses including the gaskets, an apparatus disclosed in Japanese Patent Application Laid-open No. 2019-166532 has been known.

CITATION LIST

Patent Literature

PTL 1: Japanese Patent Application Laid-open No. 2019-166532

SUMMARY OF INVENTION

Technical Problem

In the reflow apparatus, boards to which solder paste has been printed in advance are transported into and then heated in a reflow furnace of the reflow apparatus. The gasket that prevents the leakage of the in-furnace air is deteriorated along with heating of the in-furnace air. In addition, when the boards are heated, flux contained in the solder paste is vaporized into flux fumes that waft in the reflow furnace. Adhesion of these flux fumes to the gasket causes corrosion of the gasket. The gasket to which failures such as the deterioration by the heat and the corrosion by the adhesion of the flux fumes have occurred may cause the leakage of the in-furnace air.

In addition, as an example of soldering apparatuses other than the reflow apparatus, there may be mentioned a jet soldering apparatus including a jet solder bath. In this jet soldering apparatus, boards to which flux has been applied in advance are heated during a process of being transported to the jet solder bath, and then soldered with molten solder that is jetted in the jet solder bath. In the heating of the boards and the soldering in the jet solder bath, the flux is vaporized into the flux fumes. As a countermeasure, also in the jet soldering apparatus, the gasket that prevents the in-furnace air and the flux fumes from leaking to the outside of the apparatus is provided as in the reflow apparatus. In such ways, the soldering apparatuses generally include the sealing gaskets that mainly prevent the in-furnace air from leaking to the outside of the apparatuses. However, the gaskets to which the failures such as the deterioration by the heat have occurred may cause the leakage of the in-furnace air.

In the reflow apparatus disclosed in Japanese Patent Application Laid-open No. 2019-166532, nitrogen is supplied into a furnace while measuring oxygen concentration in the furnace, and it is determined that leakage of nitrogen has occurred in a case where the oxygen concentration in the furnace does not decrease to a predetermined value even after a certain time period has elapsed. In other words, the apparatus of Japanese Patent Application Laid-open No. 2019-166532 requires at least a certain time period to determine whether the oxygen concentration in the furnace has decreased to the predetermined value as a result of the occurrence of the failures of the gasket.

In addition, the reflow apparatus disclosed in Japanese Patent Application Laid-open No. 2019-166532 is incapable of determining whether or not the failures of the gasket have caused the oxygen concentration in the furnace not to decrease to the predetermined value even after the certain time period has elapsed, that is, whether or not the failures of the gasket have caused abnormalities of the oxygen concentration in the furnace.

The present invention has been made to solve the related-art problems as described above, and an object thereof is to detect failures of a gasket more promptly. In addition, another object of the present invention is to determine whether or not abnormalities of oxygen concentration in a furnace (in processing chamber) have been caused by the failures of the gasket.

The present invention achieves at least one of the objects.

Solution to Problem

According to a first aspect, there is provided a soldering apparatus. This soldering apparatus includes:
a furnace body including a processing chamber in which boards are processed;
a gasket
   provided at least to a part of the furnace body, and
   configured to seal the furnace body;
a sealed space
   isolated from the processing chamber, and
   defined by the furnace body and the gasket;
a gas supply apparatus configured to supply a first gas into the sealed space; and
a measuring apparatus configured to measure one of
   pressure in the sealed space and
   concentration of a second gas in the sealed space.

According to the first aspect, the one of the pressure and the concentration of the second gas in the sealed space can be measured after the sealed space has been filled with the first gas. Thus, in a case where the one of the pressure and the concentration of the second gas in the sealed space reaches a predetermined threshold, it can be grasped that failures of the gasket have occurred. Further, the sealed space that is defined by the gasket is located to separate the processing chamber and the outside of the furnace, and in addition, can be more easily reduced in volume than the processing chamber. Thus, unlike the related art, leakage of the gas from the sealed space that is narrower than the processing chamber can be detected before occurrence of abnormalities of the concentration of the gas such as oxygen in the processing chamber. As a result, the failures of the gasket can be more promptly detected.

According to a second aspect, the soldering apparatus according to the first aspect, in which the first gas is nitrogen.

According to the second aspect, even in a case where nitrogen that has filled the sealed space leaks into the processing chamber (into furnace), influence on an environment in the processing chamber can be suppressed.

According to a third aspect, the soldering apparatus according to the first or second aspect, in which the second gas is oxygen.

According to the third aspect, when an atmosphere in the processing chamber is monitored with an oxygen meter, this oxygen meter is connected to an inside of the sealed space. With this, measurement in the processing chamber and measurement in the sealed space can be performed alternately to each other. Thus, the number of components (number of measurement apparatuses) necessary for the soldering apparatus can be suppressed from increasing.

According to a fourth aspect, the soldering apparatus according to the first aspect, in which the first gas and the second gas are gases of the same type.

According to the fourth aspect, if the second gas of the same type as that of the first gas decreases to a predetermined value after the first gas has filled the sealed space, it can be determined that the failures of the gasket have occurred.

According to a fifth aspect, the soldering apparatus according to any one of the first to fourth aspects, in which
    the gasket includes
        a first seal,
        a second seal that is arranged away from the first seal,
        a third seal that effects sealing between the first seal and
            the second seal, and
        a fourth seal
            that effects the sealing between the first seal and the
                second seal, and
            that is arranged away from the third seal, and
    the sealed space is defined at least by
        the furnace body,
        the first seal,
        the second seal,
        the third seal, and
        the fourth seal.

According to the fifth aspect, the furnace body is sealed with the plurality of seals. Thus, even in a case where any of these seals is deteriorated, the furnace body can remain sealed by other ones of the seals.

According to a sixth aspect, the soldering apparatus according to the fifth aspect, in which
    the third seal is arranged between respective end portions
        on one side of the first seal and the second seal, and
    the fourth seal is arranged between respective end portions on another side of the first seal and the second seal.

According to the sixth aspect, the sealed space can be elongated along a transport direction of the boards. Thus, failures can be detected substantially all over the first seal and the second seal.

According to a seventh aspect, the soldering apparatus according to any one of the first to sixth aspects further including a control apparatus capable of communicating with the measuring apparatus, in which
    the control apparatus is configured to determine whether
        or not the one of the pressure and the concentration
        received from the measuring apparatus has reached a
        predetermined threshold.

According to the seventh aspect, when the one of pressure in the sealed space and the concentration of the second gas in a case where the failures of the gasket have occurred is set to a predetermined threshold, the control apparatus is enabled to determine that the failures of the gasket have occurred.

According to an eighth aspect, there is provided a method of detecting failures of a gasket that seals a furnace body including a processing chamber in which boards are processed. This method of detecting the failures of the gasket includes:
    supplying a first gas into a sealed space
        isolated from the processing chamber, and
        defined by the furnace body and the gasket;
    measuring one of
        pressure in the sealed space and
        concentration of a second gas in the sealed space; and
    determining whether or not the one of the pressure and the
        concentration of the second gas has reached a predetermined threshold.

According to the eighth aspect, the one of the pressure and the concentration of the second gas in the sealed space can be measured after the first gas has been supplied into the sealed space. Thus, in a case where the one of the pressure and the concentration of the second gas in the sealed space reaches a predetermined threshold, it can be grasped that failures of the gasket have occurred. Further, the sealed space that is defined by the gasket is located to separate the processing chamber and the outside of the furnace, and in addition, can be more easily reduced in volume than the processing chamber. Thus, unlike the related art, leakage of the gas from the sealed space that is narrower than the processing chamber can be detected before occurrence of abnormalities of the concentration of the gas such as oxygen in the processing chamber. As a result, the failures of the gasket can be more promptly detected.

According to a ninth aspect, the method according to the eighth aspect, in which the first gas is nitrogen.

According to the ninth aspect, even in a case where nitrogen that has filled the sealed space leaks into the processing chamber, influence on an environment in the processing chamber can be suppressed.

According to a tenth aspect, the method according to the eighth or ninth aspect, in which the second gas is oxygen.

According to the tenth aspect, when an atmosphere in the processing chamber is monitored with an oxygen meter, this oxygen meter is connected to an inside of the sealed space. With this, measurement in the processing chamber and measurement in the sealed space can be performed alternately to each other. Thus, the number of components (number of measurement apparatuses) necessary for implementing the method of detecting the failures of the gasket can be suppressed from increasing.

DESCRIPTION OF EMBODIMENTS

Figure 1:
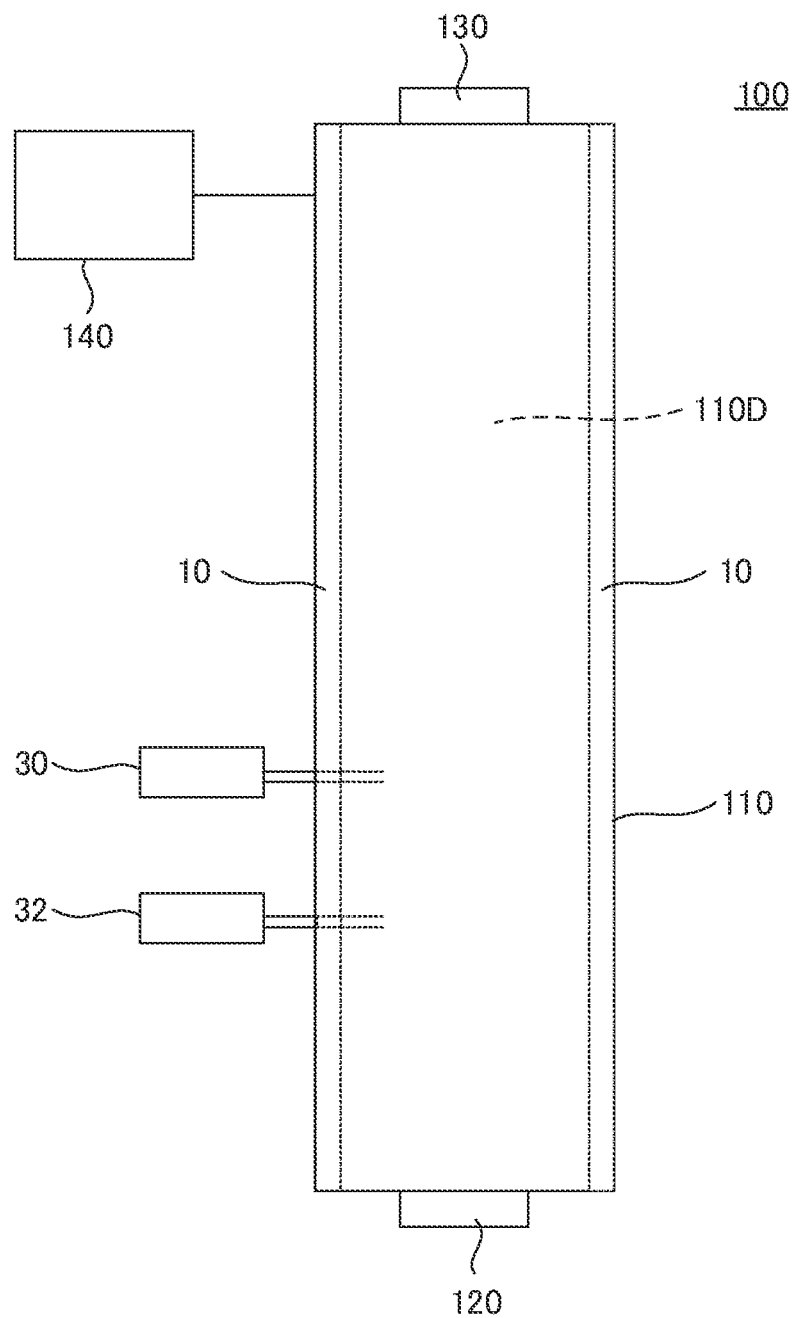
FIG. 1 is a schematic top view of a reflow apparatus according to an embodiment of the present invention.

Now, an embodiment of the present invention is described with reference to the drawings. In the drawings referred to below, the same or corresponding components are denoted by the same reference symbols to omit redundant description thereof. Note that, although a reflow apparatus is exemplified as a soldering apparatus of the present invention in the embodiment described below, the soldering apparatus is not limited thereto, and any soldering apparatus in which the gaskets are used as described above may be encompassed within the scope of the present invention.

Figure 2:
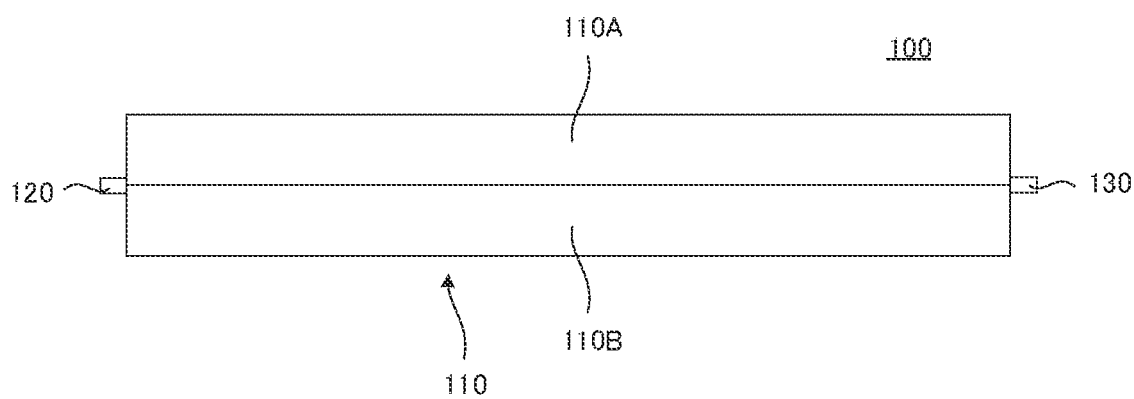
FIG. 2 is a schematic side view of the reflow apparatus according to the embodiment of the present invention.

FIG. 1 is a schematic top view of the reflow apparatus according to this embodiment. FIG. 2 is a schematic side view of the reflow apparatus according to this embodiment. As illustrated in FIG. 1 and FIG. 2, this reflow apparatus 100 includes a furnace body 110, a carry-in port 120, a carry-out port 130, and a control apparatus 140. The furnace body 110 includes therein a processing chamber 110D in which boards (not shown) are processed. The carry-in port 120 is an inlet for allowing the boards to which solder paste has been applied (not shown) to be carried into the processing chamber 110D in the furnace body 110. The carry-out port 130 is an outlet for allowing the heated boards (not shown) to be carried out of the processing chamber 110D in the furnace body 110. The reflow apparatus 100 according to this embodiment need not necessarily include the single carry-in port 120 and the single carry-out port 130, and may, for example, include two or more carry-in ports 120 and as many carry-out ports 130 such that a larger number of boards are processed at the same time.

The reflow apparatus 100 includes a transport conveyor (not shown) for transporting the boards, which have been fed through the carry-in port 120, to the carry-out port 130. The furnace body 110 includes therein a configuration that heats, from above and below, the boards having been carried in through the carry-in port 120, and then cools the heated boards. Specifically, for example, the furnace body 110 includes therein a plurality of heating zones and at least one cooling zone arranged in line. The boards that have been carried in through the carry-in port 120 are transported toward the carry-out port 130 at a predetermined speed. The boards are preliminarily heated at a preliminary heating portion in one of the heating zones, and then heated to a predetermined temperature at a main heating portion in another one of the heating zones. During these processes, the solder paste on the boards is molten, and flux fumes are generated at the time when the solder paste is molten. In the cooling zone, the boards are rapidly cooled to solidify the solder.

The control apparatus 140 is configured, for example, to be capable of controlling an operation of the reflow apparatus 100 according to this embodiment, and is communicably connected to the transport conveyor, the heating zones, and the cooling zone (none of which is shown). The control apparatus 140 may include, for example, a CPU, a memory that stores operating programs, and a PLC (Programmable Logic Controller) that includes an input/output unit. In addition, the control apparatus 140 is configured to be capable of controlling operations of a measuring apparatus 30 and a gas supply apparatus 32 described below.

The reflow apparatus 100 may have the gas supply apparatus 32 configured to supply an inert gas such as nitrogen (corresponding to an example of a first gas) into the processing chamber 110D, and the measuring apparatus 30. The measuring apparatus 30 may be a gas concentration sensor that measures concentration of a gas such as oxygen (corresponding to an example of a secondary gas). In the reflow apparatus 100, the gas supply apparatus 32 supplies the inert gas such as nitrogen such that oxygen concentration in the processing chamber 110D is reduced. The measuring apparatus 30 measures the oxygen concentration in the processing chamber 110D. Data of the oxygen concentration measured by the measuring apparatus 30 may be transmitted, for example, to the control apparatus 140 or an external computer other than the control apparatus 140. This enables an operator to check whether an atmosphere in the processing chamber 110D is normal.

As illustrated in FIG. 2, the furnace body 110 includes an upper furnace body 110A and a lower furnace body 110B. The upper furnace body 110A and the lower furnace body 110B are coupled to each other with, for example, hinges, and the upper furnace body 110A is configured to be openable/closable on its one side relative to the lower furnace body 110B such that internal maintenance and the like can be performed. In this embodiment, in order that in-furnace air is prevented from leaking through a superimposition plane between the upper furnace body 110A and the lower furnace body 110B, as illustrated in FIG. 1, a gasket 10 is provided to at least one of the upper furnace body 110A and the lower furnace body 110B. The gasket 10 may be formed of an arbitrary sealing material such as a silicone sponge. Specifically, in this embodiment, along a direction in which the carry-in port 120 and the carry-out port 130 are linked to each other (transport direction of the boards), the gasket 10 is provided along both edges of opening portions of the lower furnace body 110B. This prevents the leakage of the in-furnace air under a state in which the upper furnace body 110A and the lower furnace body 110B are closed to each other. Thus, during the process of heating the boards, the flux fumes generated in the furnace body 110 also can be suppressed from flowing to an outside of the furnace body 110. Note that, the gasket 10 may be provided to the upper furnace body 110A.

In the reflow apparatus 100 as described above in this embodiment, the gasket 10 is deteriorated along with heating of the in-furnace air. In addition, adhesion of the flux fumes causes corrosion of the gasket 10. The gasket 10 to which failures such as the deterioration by the heat and the corrosion by the adhesion of the flux fumes have occurred may cause the leakage of the in-furnace air. As a countermeasure, it is conceivable to detect the leakage of the in-furnace air by measuring concentration of a specific one of the gases in the processing chamber 110D of the furnace body 110. However, it may take time to determine whether or not the concentration of the specific one of the in-furnace gases has reached a predetermined value as a result of the occurrence of the failures of the gasket 10.

Figure 3:
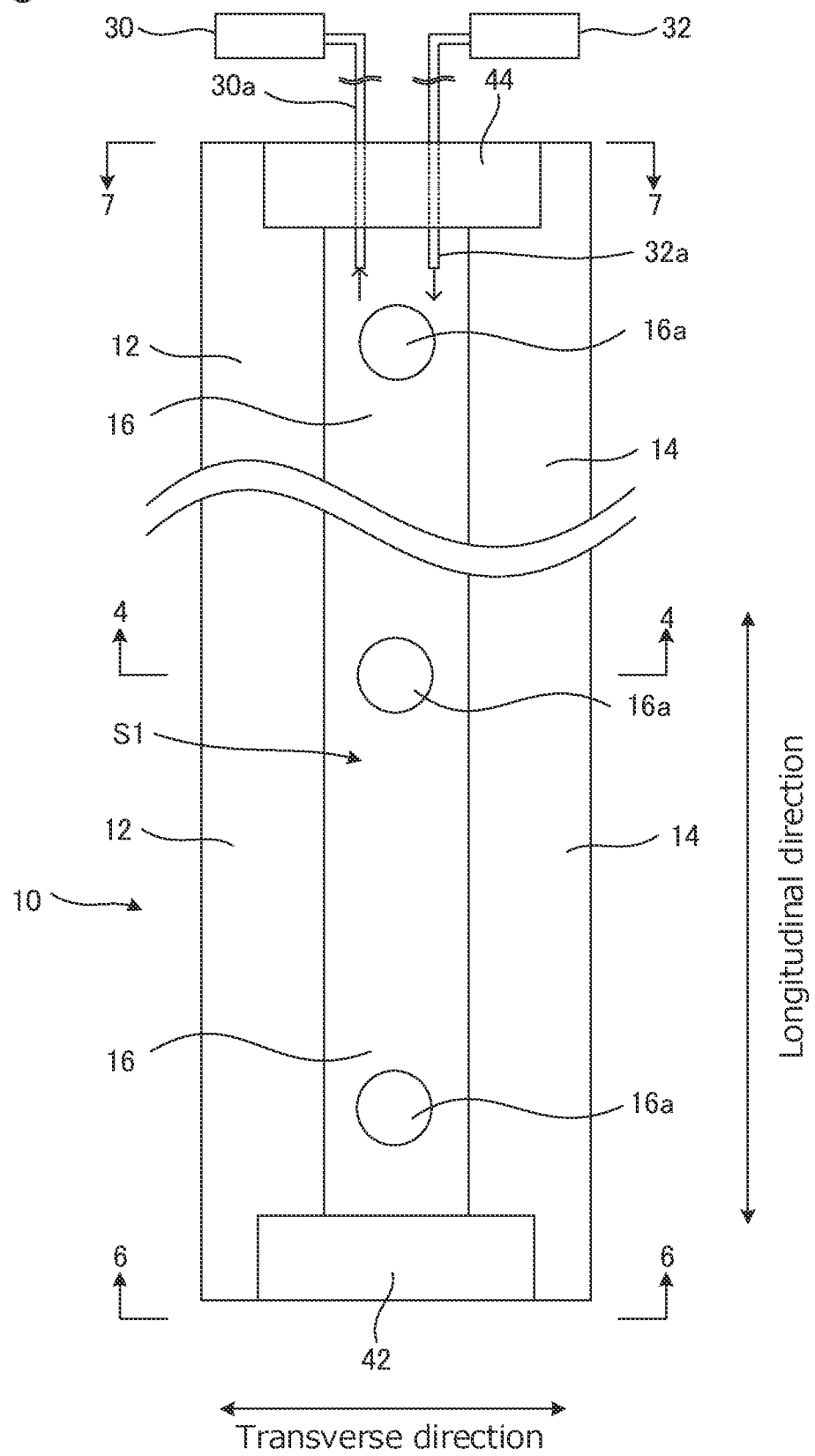
FIG. 3 is a top view of a gasket according to the embodiment of the present invention.
Figure 4:
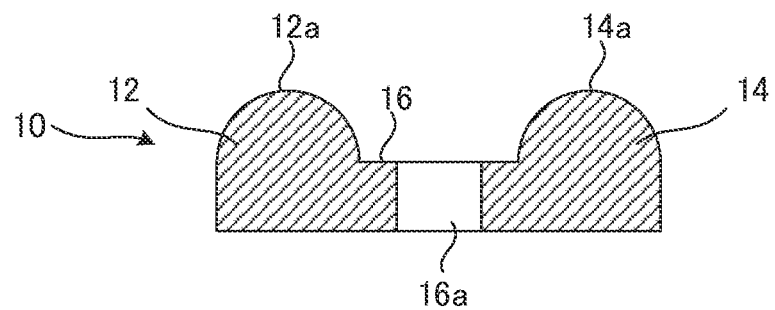
FIG. 4 is a cross-sectional view of the gasket, which is taken along arrows 4-4 in FIG. 3.

In view of such circumstances, in the reflow apparatus 100 according to this embodiment, a sealed space isolated from the processing chamber 110D is formed with use of the gasket 10 such that the failures of the gasket 10 are more promptly detected. FIG. 3 is a top view of the gasket 10 according to this embodiment. FIG. 4 is a cross-sectional view of the gasket 10, which is taken along arrows 4-4 in FIG. 3. As illustrated in FIG. 3 and FIG. 4, the gasket 10 according to this embodiment includes a first seal 12, a second seal 14, and a fixation portion 16. The first seal 12, the second seal 14, and the fixation portion 16 extend along the direction in which the carry-in port 120 and the carry-out port 130 illustrated in FIG. 1 are linked to each other (transport direction of the boards), that is, along each of both the edges of the opening portions of the upper furnace body 110A and the lower furnace body 110B. The first seal 12 and the second seal 14 are arranged away from each other, and the fixation portion 16 is located therebetween.

As illustrated in FIG. 4, the first seal 12 and the second seal 14 respectively have a first sealing surface 12a and a second sealing surface 14a to be held in contact with the upper furnace body 110A. As illustrated in FIG. 4, in this embodiment, the first sealing surface 12a and the second sealing surface 14a each have a semi-circular shape in cross-section. Alternatively, the first sealing surface 12a and the second sealing surface 14a may each have an arbitrary protruding shape.

Although the first seal 12 and the second seal 14 may have thicknesses and shapes different from each other, as illustrated in FIG. 4, in this embodiment, the first seal 12 and the second seal 14 each have substantially the same thickness and substantially the same shape. This enables substantially-uniform pressure application to the first seal 12 and the second seal 14 under the state in which the furnace body 110 is closed. As a result, degrees of deterioration of the first seal 12 and the second seal 14 can be further equalized to each other.

The fixation portion 16 is a plate-like part to be coupled to the first seal 12 and the second seal 14. In other words, the fixation portion 16 has a function to couple the first seal 12 and the second seal 14 integrally to each other. The fixation portion 16 is located between the first seal 12 and the second seal 14, and extends in the same direction as a direction in which the first seal 12 and the second seal 14 extend. As illustrated in FIG. 3, the fixation portion 16 has a plurality of through-holes 16a. As described below, by inserting push rivets into the through-holes 16a, the gasket 10 can be fixed in an attachable/detachable manner to the furnace body 110.

In addition, as illustrated in FIG. 4, the fixation portion 16 is thinner than each of the first seal 12 and the second seal 14. This configuration prevents the push rivets arranged in the fixation portion 16 from protruding higher than the first seal 12 and the second seal 14 under the state in which the furnace body 110 is sealed. In this way, this configuration does not physically influence the sealing of the furnace body 110.

Figure 5A:
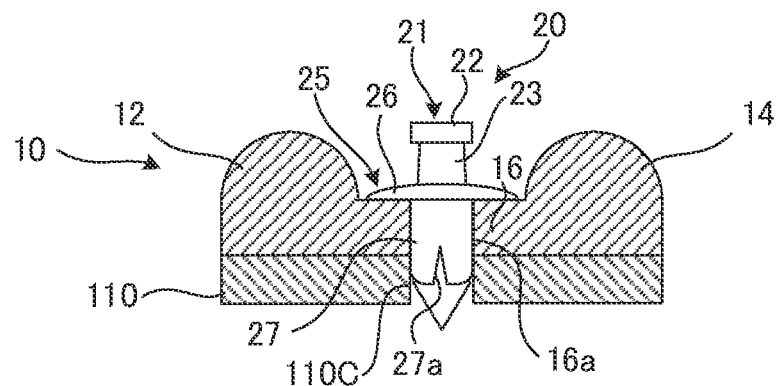
FIG. 5A is a view illustrating a procedure for attaching the gasket with use of push rivets.
Figure 5B:
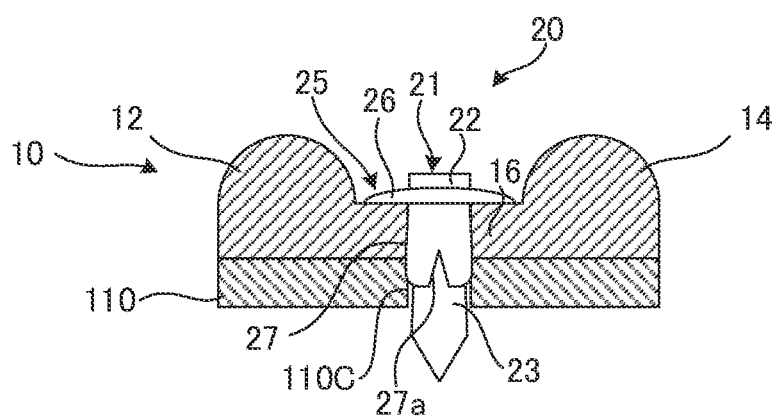
FIG. 5B is another view illustrating the procedure for attaching the gasket with use of the push rivets.
Figure 5C:
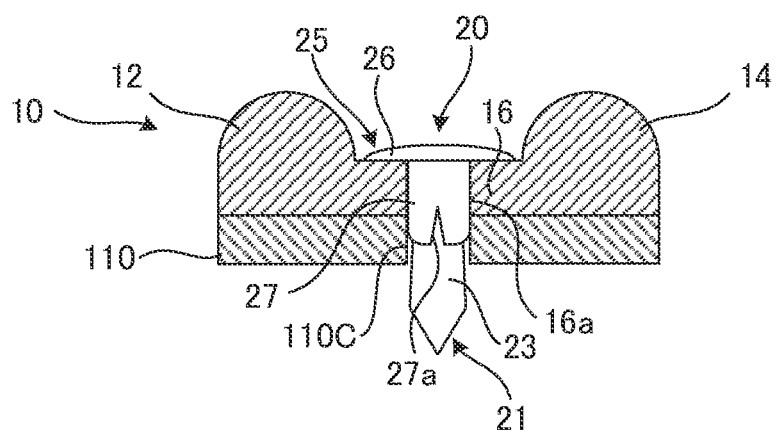
FIG. 5C is a still another view illustrating the procedure for attaching the gasket with use of the push rivets.

Next, a procedure for attaching the gasket 10 illustrated in FIG. 3 and FIG. 4 to the furnace body 110 is described. FIG. 5A, FIG. 5B, and FIG. 5C are views illustrating the procedure for attaching the gasket 10 with use of the push rivets. FIG. 5A to FIG. 5C illustrate a part of the furnace body 110, where holes 110C that allow the push rivets to be inserted thereinto are provided at corresponding parts in the furnace body 110. As illustrated in FIG. 5A, a push rivet 20 includes a pin 21 and a rivet body 25. The pin 21 includes a head portion 22 and a shaft portion 23. The shaft portion 23 includes a tapered part such that a diameter of the shaft portion 23 gradually increases toward a distal end of the pin 21. The rivet body 25 includes a flange portion 26 and a leg portion 27 extending from the flange portion 26. The flange portion 26 has a hole that allows the pin 21 to be inserted thereinto, and the leg portion 27 is formed into a substantially cylindrical shape so as to allow the pin 21 to be inserted thereinto. The leg portion 27 includes notch portions 27a at an end portion on the distal end side of the pin 21.

The gasket 10 is attached to the furnace body 110 as follows. First, the gasket 10 is arranged in the furnace body 110, and as illustrated in FIG. 5A, the push rivet 20 is inserted into the through-hole 16a of the gasket 10 and the hole 110C of the furnace body 110. Under the state illustrated in FIG. 5A, the gasket 10 has not yet been fixed to the furnace body 110.

Then, as illustrated in FIG. 5B, an operator or the like pushes the head portion 22 of the pin 21 into the rivet body 25. At this time, the shaft portion 23 of the pin 21 causes the leg portion 27 of the rivet body 25 to radially expand. With this, the leg portion 27 of the rivet body 25 is pressed against an inner peripheral surface of the hole 110C of the furnace body 110. In this way, the push rivet 20 is fixed to the furnace body 110. The gasket 10 is pressed against the furnace body 110 by the flange portion 26 of the rivet body 25. In this way, the gasket 10 is fixed to the furnace body 110 by the push rivet 20.

In order to detach the gasket 10 from the furnace body 110, as illustrated in FIG. 5C, the pin 21 of the push rivet 20 is further pushed in toward the distal end. As a result, a relatively radially-small part of the pin 21 comes to an inside of the rivet body 25. With this, the leg portion 27 of the rivet body 25 is radially shrunk (enters a straight state). In this state, the push rivet 20 is pulled out of the through-hole 16a of the gasket 10 and the hole 110C of the furnace body 110. In this way, the fixation of the gasket 10 is released.

As described above, the gasket 10 is fixed in the attachable/detachable manner to the furnace body 110 by the push rivet 20. The push rivet 20 can be easily attached and detached by the operator, and hence the gasket 10 can be easily attached to and detached from the furnace body 110. Further, in this embodiment, by inserting the push rivet 20 into the through-hole 16a of the gasket 10, the flange portion 26 is brought into direct contact with the gasket 10, whereby the gasket 10 can be fixed to the furnace body 110. Still further, in this fixed state, by further pushing in the pin 21 of the push rivet 20 toward the distal end, and then by pulling the push rivet 20 out of the through-hole 16a of the gasket 10 and the hole 110C of the furnace body 110, the fixation of the gasket 10 is released. With this, efficiency at the time of the operation to attach the gasket 10 and maintainability at the time of replacing the gasket 10 can be increased to be higher than those in the related-art fixation methods including using screws or bond.

The first seal 12 and the second seal 14 need not necessarily be fixed with the push rivet 20, and may be fixed to the furnace body 110 with an arbitrary adhesive. In addition, in that case, the through-hole 16a of the fixation portion 16 may be omitted, or the fixation portion 16 itself may be omitted. In other words, the first seal 12 and the second seal 14 may be fixed as independent members to the furnace body 110 with the arbitrary adhesive.

Figure 6:
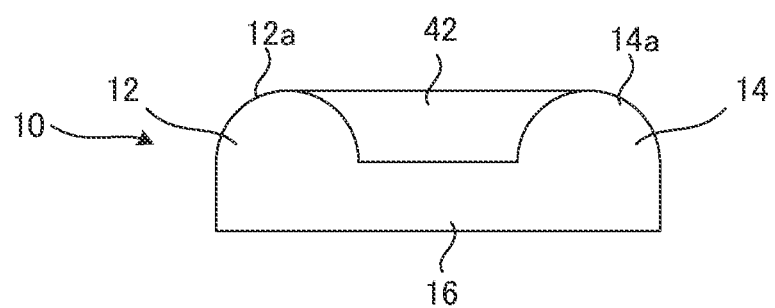
FIG. 6 is a side view of the gasket, which is taken along arrows 6-6 in FIG. 3.
Figure 7:
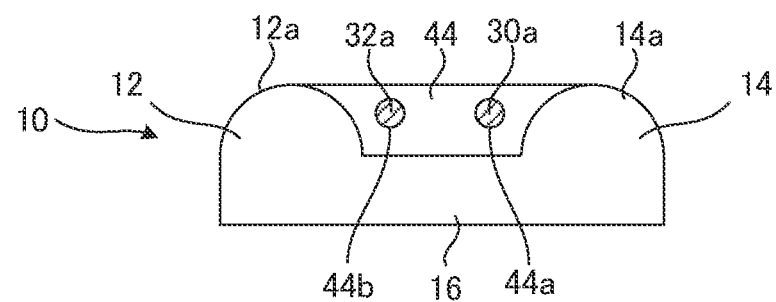
FIG. 7 is a side view of the gasket 10, which is taken along arrows 7-7.

Referring back to FIG. 3, the gasket 10 is described in detail. As illustrated in FIG. 3, the gasket 10 further includes a third seal 42 and a fourth seal 44. FIG. 6 is a side view of the gasket 10, which is taken along arrows 6-6 in FIG. 3. FIG. 7 is a side view of the gasket 10, which is taken along arrows 7-7. The third seal 42 and the fourth seal 44 are arranged between the first seal 12 and the second seal 14, and are configured to effect sealing between the first seal 12 and the second seal 14. Similar to the first seal 12 and the second seal 14, the third seal 42 and the fourth seal 44 may be formed of the arbitrary sealing material such as the silicone sponge. The third seal 42 and the fourth seal 44 may each have an arbitrary shape as long as the sealing between the first seal 12 and the second seal 14 can be effected. In the example illustrated in FIG. 6 and FIG. 7, the third seal 42 and the fourth seal 44 each have such a shape that fills a gap between the first seal 12 and the second seal 14.

As illustrated in FIG. 3, the third seal 42 and the fourth seal 44 are arranged away from each other. In the example illustrated in FIG. 3, the third seal 42 is arranged between respective end portions on one side of the first seal 12 and the second seal 14 (lower end portions in the illustration). The fourth seal 44 is arranged between respective end portions on another side of the first seal 12 and the second seal 14 (upper end portions in the illustration). This enables a sealed space S1 to be elongated along the transport direction of the boards, and hence failures can be detected substantially all over the first seal 12 and the second seal 14.

As illustrated in FIG. 3, the gaps between the first seal 12 and the second seal 14 are sealed with the first seal 12 and the second seal 14 that are away from each other and with the third seal 42 and the fourth seal 44 that are away from each other. With this, when the furnace body 110 is closed, the sealed space S1 is defined by the furnace body 110 and the gasket 10. In other words, in the example illustrated in FIG. 3, the sealed space S1 is defined at least by the furnace body 110, the first seal 12, the second seal 14, the third seal 42, and the fourth seal 44. This sealed space S1 is isolated from the processing chamber 110D of the furnace body 110 to serve as an independent space. In this embodiment, since the gasket 10 includes the plurality of seals, specifically, the first seal 12, the second seal 14, the third seal 42, and the fourth seal 44, even in a case where any of these seals is deteriorated, the furnace body 110 can remain sealed by other ones of the seals.

The reflow apparatus 100 further includes the measuring apparatus 30 and the gas supply apparatus 32. These measuring apparatus 30 and gas supply apparatus 32, which desirably serve also as the measuring apparatus 30 and the gas supply apparatus 32 illustrated in FIG. 1, may be provided in addition thereto. With this, the number of components of the reflow apparatus 100 can be reduced. The gas supply apparatus 32 is configured to supply the inert gas such as nitrogen (corresponding to the example of the first gas) into the sealed space S1. The gas supply apparatus 32 includes a gas source, and supplies the gas into the sealed space S1 through a supply pipe 32a In the example illustrated in FIG. 3, a part of the supply pipe 32a is located in the sealed space S1 through the fourth seal 44. Note that, the gas to be supplied by the gas supply apparatus 32 is not limited to the inert gas, and may be an arbitrary gas. However, in order that influence on an environment in the processing chamber 110D is suppressed even in a case where the gas filling the sealed space S1 leaks into the processing chamber 110D, the gas is desirably the inert gas such as nitrogen.

The measuring apparatus 30 measures pressure or concentration of the gas in the sealed space S1. The measuring apparatus 30 may be, for example, a pressure sensor that measures the pressure in the sealed space S1. Alternatively, the measuring apparatus 30 may be, for example, a gas concentration sensor that measures the concentration of the gas such as oxygen (corresponding to the example of the secondary gas). As the oxygen concentration sensor, for example, there may be employed an EcoaZ EZY series manufactured by Daiichinekken Co., Ltd. In the example illustrated in FIG. 3, the measuring apparatus 30 is arranged on an outside of the sealed space S1, and a communication pipe 30a that is connected to the measuring apparatus 30 extends into the sealed space S1 through the fourth seal 44. The measuring apparatus 30 is configured to be capable of measuring the concentration of the gas in the sealed space S1 by sucking the gas through the communication pipe 30a, and of transmitting measurement data, for example, to the control apparatus 140.

As illustrated in FIG. 7, the fourth seal 44 includes a piping hole 44a through which the communication pipe 30a that is connected to the measuring apparatus 30 passes, and a piping hole 44b through which the supply pipe 32a from the gas supply apparatus 32 passes. The piping hole 44a has a diameter slightly smaller than a diameter of the communication pipe 30a such that the gas in the sealed space S1 can be suppressed from leaking through between the communication pipe 30a and the piping hole 44a. Similarly, the piping hole 44b has a diameter slightly smaller than a diameter of the supply pipe 32a from the gas supply apparatus 32 such that the gas in the sealed space S1 can be suppressed from leaking through between the supply pipe 32a and the piping hole 44b. Note that, the fourth seal 44 need not necessarily include the piping hole 44a or the piping hole 44b. In that case, both the communication pipe 30a and the supply pipe 32a may be arranged to extend between the fourth seal 44 and the first seal 12, the second seal 14, the third seal 42, or the fixation portion 16. When the furnace body 110 is closed, the first seal 12, the second seal 14, the third seal 42, and the fourth seal 44 are compressed and deformed. With this, gaps between the communication pipe 30a and the supply pipe 32a and the gasket 10 are closed. As a result, the leakage of the gas in the sealed space S1 can be suppressed. Alternatively, both the communication pipe 30a and the supply pipe 32a may be arranged to extend through any of the first seal 12, the second seal 14, the third seal 42, and the fixation portion 16. In other words, as long as the communication pipe 30a and the supply pipe 32a can be connected to an inside of the sealed space S1 while maintaining the sealed state, the communication pipe 30a and the supply pipe 32a may be arbitrarily located. Note that, the measuring apparatus 30 may be arranged in the sealed space S1.

Note that, by fitting the push rivet 20 rigidly into the through-hole 16a, the gas in the sealed space S1 can be prevented from leaking through the through-hole 16a formed in the fixation portion 16.

Figure 8:
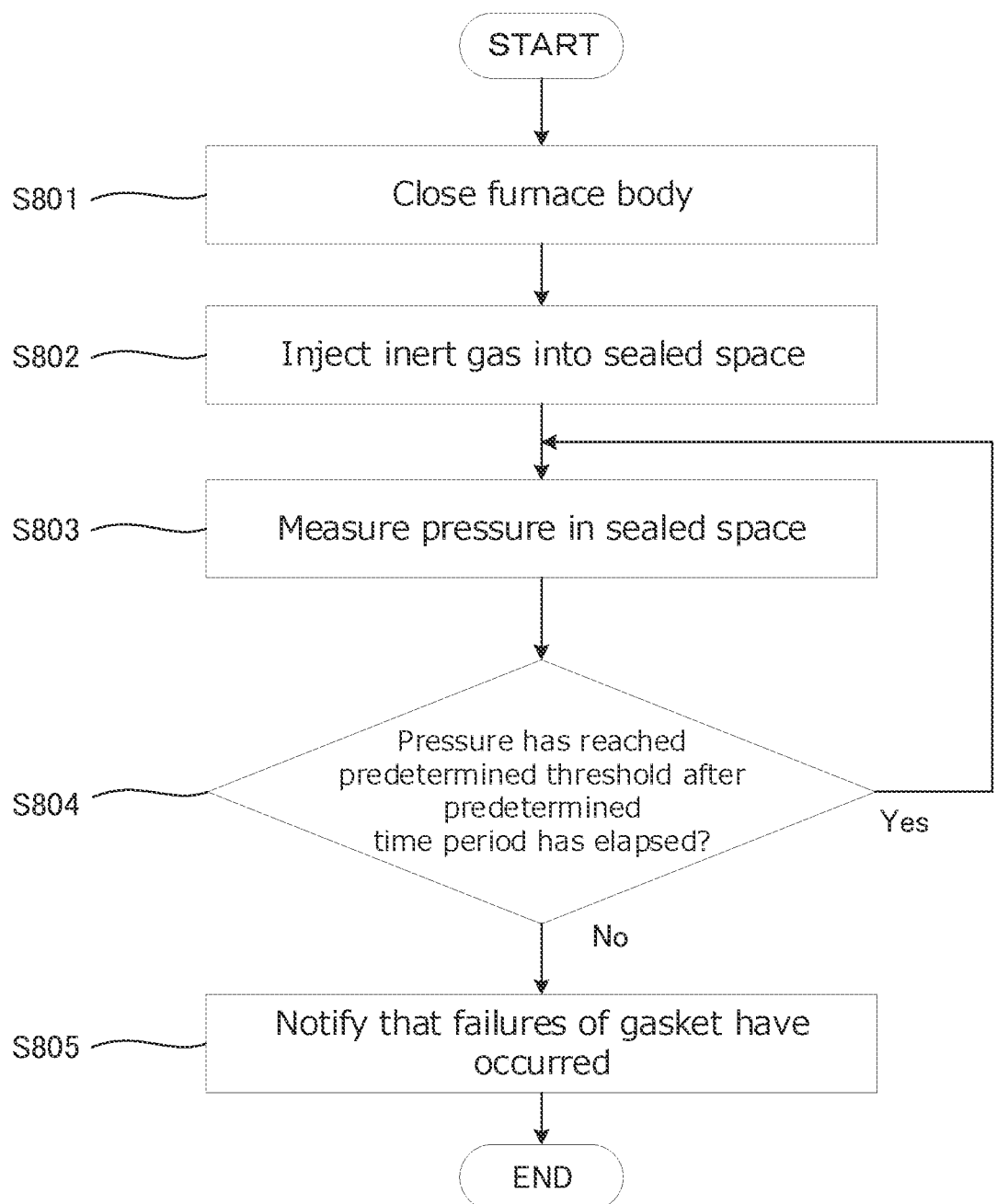
FIG. 8 is a flowchart showing a method of detecting failures of the gasket in the reflow apparatus according to the embodiment of the present invention.

Now, a method of detecting the failures of the gasket 10 is described. FIG. 8 is a flowchart showing the method of detecting the failures of the gasket 10 in the reflow apparatus 100 according to this embodiment. FIG. 8 shows the example in which the measuring apparatus 30 is the pressure sensor. First, the furnace body 110 is closed (Step S801). With this, the sealed space S1 isolated from the processing chamber 110D of the furnace body 110 is defined by the furnace body 110 and the gasket 10. Then, the gas supply apparatus 32 injects the inert gas such as nitrogen into the sealed space S1 through the supply pipe 32a (Step S802). The inert gas may be injected by a predetermined injection amount into the sealed space S1. When the measuring apparatus 30 is the pressure sensor, the inert gas may be injected to cause the pressure in the sealed space S1 to reach predetermined pressure.

After the inert gas has been supplied into the sealed space S1, the measuring apparatus 30 measures the pressure in the sealed space S1 via the communication pipe 30a at an arbitrary timing (Step S803). The measurement data obtained by the measuring apparatus 30 is transmitted, for example, to the control apparatus 140. Alternatively, the measurement data may be transmitted to the external computer other than the control apparatus 140.

Next, after a predetermined time period has elapsed since the injection of the inert gas from the gas supply apparatus 32, it is determined whether or not the pressure measured by the measuring apparatus 30 has reached a predetermined threshold (Step S804). Specifically, the control apparatus 140 compares a value of the pressure measured by the measuring apparatus 30 to the predetermined threshold, and determines whether or not the value of the measured pressure has increased to this threshold. If it is determined that the value of the pressure has not reached the threshold even after the predetermined time period has elapsed (No in Step S804), it is estimated that the gas in the sealed space S1 has leaked to the outside of the sealed space S1.

When the control apparatus 140 includes a display capable of displaying the value measured by the measuring apparatus 30, this measured value may be displayed on the display. In this case, the operator may check the value displayed on the display, and the operator may determine whether or not this value has reached the predetermined threshold.

If the measuring apparatus 30 determines that the pressure has not reached the predetermined threshold even after the predetermined time period has elapsed (No in Step S804), the control apparatus 140 causes a notification apparatus (not shown) provided to the reflow apparatus 100 to notify the operator that the failures of the gasket 10 have occurred (Step S805). This notification apparatus may be, for example, a display apparatus that is provided to the control apparatus 140 and that displays the failures, or an alarm apparatus that notifies the operator of the failures by sound or vibration. Note that, if the operator determines whether or not the measured value displayed on the display has reached the predetermined threshold in Step S804, Step S805 may be omitted. Meanwhile, if it is determined that the value of the pressure has reached the threshold, that is, the value of the pressure has increased to the threshold (Yes in Step S804), it is determined that the failures of the gasket 10 have not occurred, and the processes of Step S803 and Step S804 are repeated.

Figure 9:
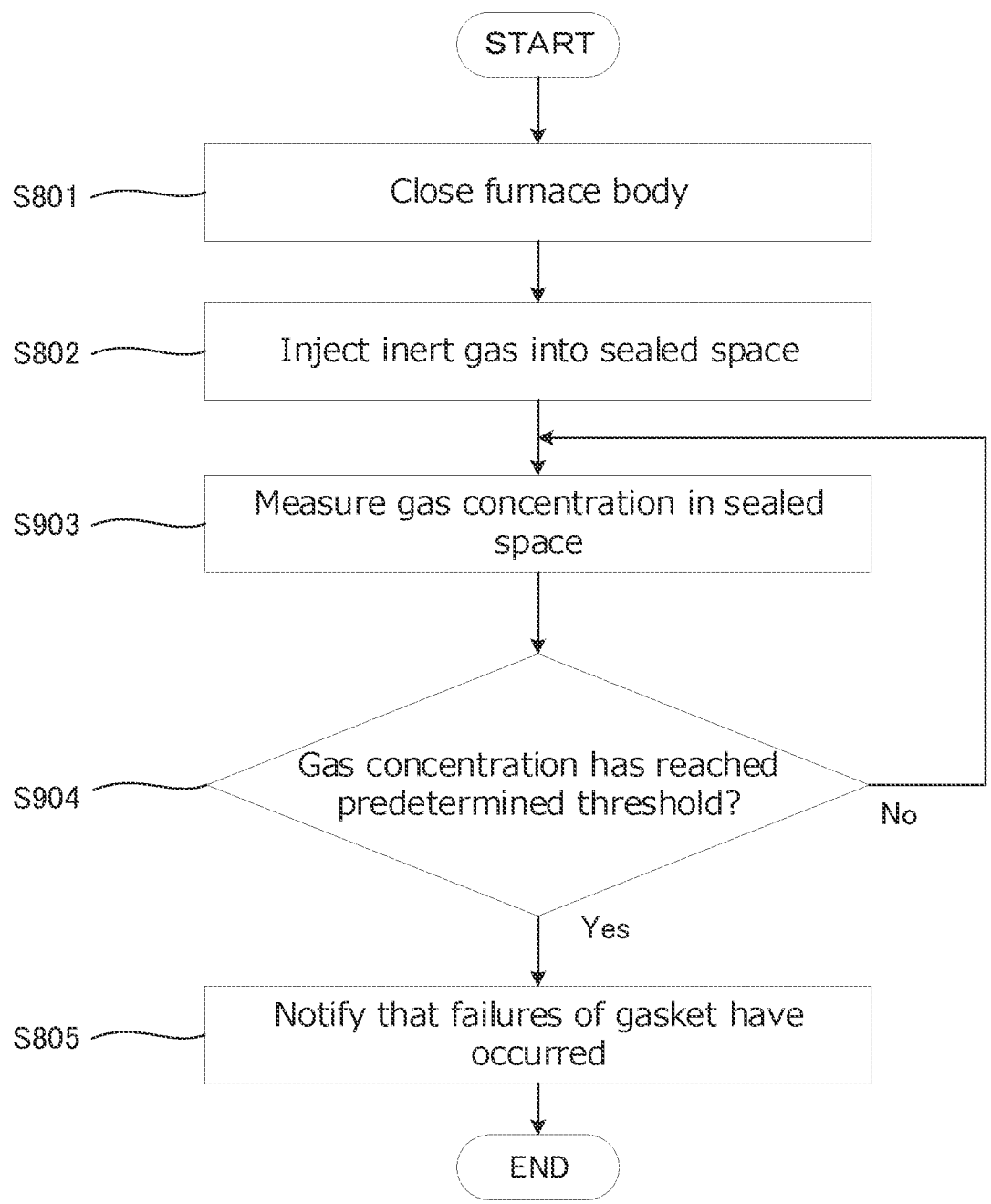
FIG. 9 is a flowchart showing another method of detecting the failures of the gasket in the reflow apparatus according to the embodiment of the present invention.

FIG. 9 is a flowchart showing another method of detecting the failures of the gasket 10 in the reflow apparatus 100 according to this embodiment. FIG. 9 shows the example in which the measuring apparatus 30 is the gas concentration sensor. In FIG. 9, the same processes as those shown in FIG. 8 are denoted by the same reference symbols to omit redundant description thereof.

After the inert gas has been supplied into the sealed space S1 in Step S802, the measuring apparatus 30 measures concentration of a certain gas in the sealed space S1 via the communication pipe 30a at an arbitrary timing (Step S903). Specifically, when the measuring apparatus 30 is the oxygen concentration sensor, the measuring apparatus 30 measures oxygen concentration in the sealed space S1. The measurement data obtained by the measuring apparatus 30 is transmitted, for example, to the control apparatus 140. Alternatively, the measurement data may be transmitted to the external computer other than the control apparatus 140.

Next, after a predetermined time period has elapsed since the injection of the inert gas from the gas supply apparatus 32, it is determined whether or not the gas concentration measured by the measuring apparatus 30 has reached a predetermined threshold (Step S904). Specifically, when the measuring apparatus 30 is the oxygen concentration sensor, the control apparatus 140 compares a value of the oxygen concentration measured by the measuring apparatus 30 to the predetermined threshold, and determines whether or not the value of the oxygen concentration has reached this threshold. If it is determined that the value of the oxygen concentration has not reached the threshold (No in Step S904), the processes of Step S903 and Step S904 are repeated. Meanwhile, if it is determined that the value of the oxygen concentration has reached the threshold, that is, the value of the oxygen concentration has increased to the threshold (Yes in Step S904), it is estimated that the oxygen concentration has increased due to ingress of oxygen from the outside of the sealed space S1 into the sealed space S1.

Alternatively, the measuring apparatus 30 may be a sensor that measures a gas of the same type as that of the gas to be injected into the sealed space S1 by the gas supply apparatus 32 (corresponding to an example of a second gas). Specifically, for example, when the gas supply apparatus 32 supplies nitrogen into the sealed space S1, the measuring apparatus 30 may be a nitrogen concentration sensor. In this case, the control apparatus 140 compares a value of nitrogen concentration measured by the measuring apparatus 30 to a predetermined threshold, and determines whether or not the value of the nitrogen concentration has reached this threshold. If it is determined that the value of the nitrogen concentration has not reached the threshold (No in Step S904), the processes of Step S903 and Step S904 are repeated. Meanwhile, if it is determined that the value of the nitrogen concentration has reached the threshold, that is, the value of the nitrogen concentration has decreased to the threshold (Yes in Step S904), it is estimated that nitrogen in the sealed space S1 has leaked to the outside of the sealed space S1.

If the measuring apparatus 30 determines that the gas concentration has reached the predetermined threshold (Yes in Step S904), the control apparatus 140 causes the notification apparatus (not shown) provided to the reflow apparatus 100 to notify the operator that the failures of the gasket 10 have occurred (Step S805).

Figure 10:
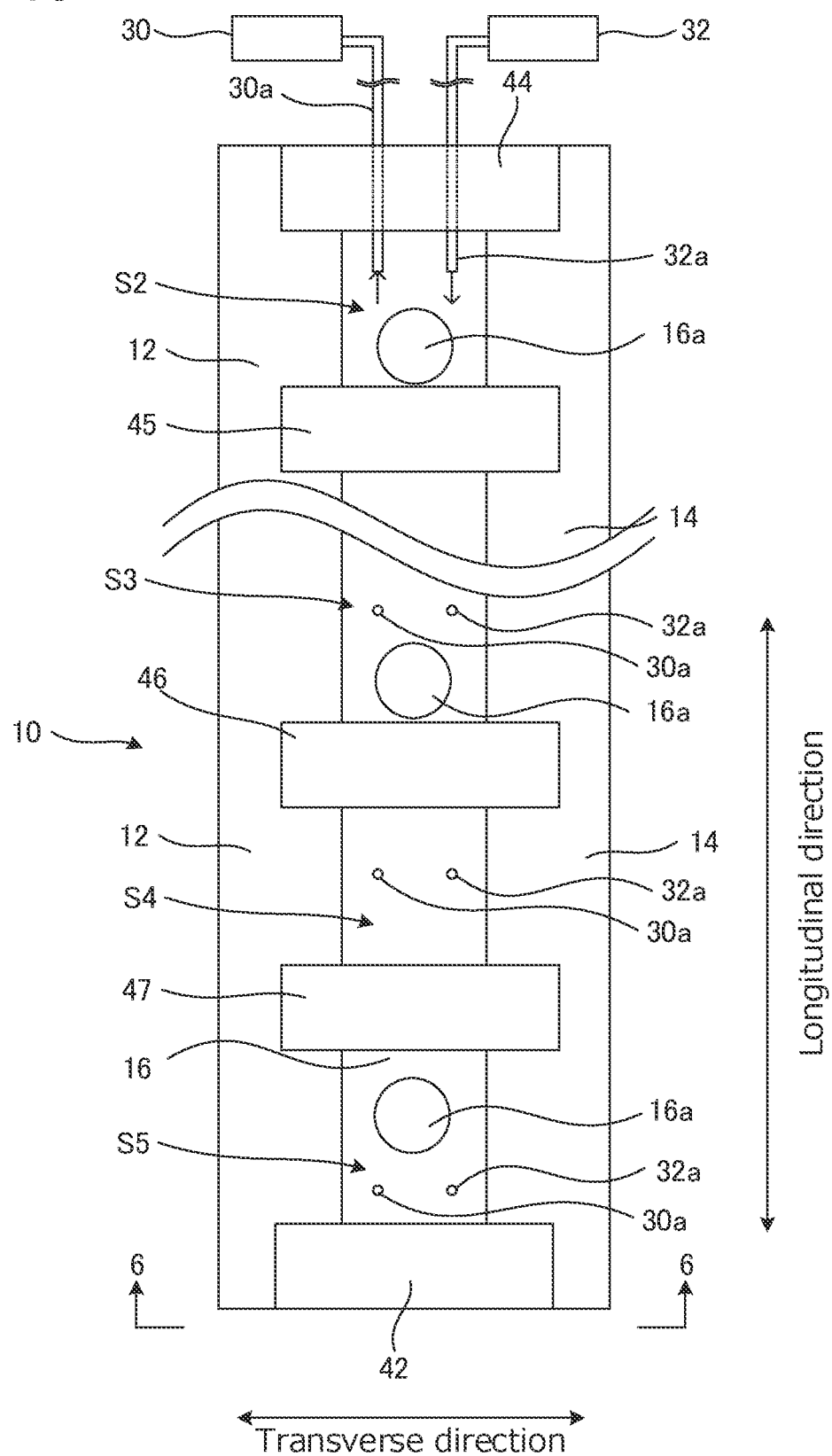
FIG. 10 is a top view illustrating another example of the gasket according to the embodiment of the present invention.

Next, another example of the gasket 10 according to this embodiment is described. FIG. 10 is a top view illustrating the other example of the gasket 10 according to this embodiment. The gasket 10 illustrated in FIG. 10 is different from the gasket 10 illustrated in FIG. 3 in further including a fifth seal 45, a sixth seal 46, and a seventh seal 47 that effect the sealing between the first seal 12 and the second seal 14. Note that, although not shown, still other seals that effect the sealing between the first seal 12 and the second seal 14 may be provided. The third seal 42, the fourth seal 44, the fifth seal 45, the sixth seal 46, and the seventh seal 47 are away from each other.

The third seal 42, the fourth seal 44, the fifth seal 45, the sixth seal 46, and the seventh seal 47 of the gasket 10 illustrated in FIG. 10 effect the sealing between the first seal 12 and the second seal 14. With this, when the furnace body 110 is closed, a plurality of sealed spaces S2, S3, S4, and S5 are defined by the furnace body 110 and the gasket 10. In other words, the sealed space S1 that is formed by the gasket 10 illustrated in FIG. 3 is divided by the fifth seal 45, the sixth seal 46, and the seventh seal 47 of the gasket 10 illustrated in FIG. 10.

As illustrated in FIG. 10, the communication pipe 30a and the supply pipe 32a are connected to an inside of each of the sealed spaces S2, S3, S4, and S5. In the illustrated example, in the sealed space S2, the communication pipe 30a and the supply pipe 32a are connected to the inside of the sealed space S2 through the fourth seal 44. In the sealed spaces S3, S4, and S5, the communication pipe 30a and the supply pipe 32a are connected to the inside of each of the sealed spaces S3, S4, and S5 through the fixation portion 16. As long as the communication pipe 30a and the supply pipe 32a communicate with the inside of each of the sealed spaces S2, S3, S4, and S5, positions of these pipes are not limited. The respective communication pipes 30a may be connected to the single measuring apparatus 30, or may be connected respectively to independent measuring apparatuses 30. The respective supply pipes 32a may be connected to the single measuring apparatus 30, or may be connected respectively to independent gas supply apparatuses 32. The inert gas such as nitrogen may be supplied from the gas supply apparatus 32 into the sealed spaces S2, S3, S4, and S5 respectively through the supply pipes 32a. In addition, pressure or concentration of the gas in the sealed spaces S2, S3, S4, and S5 may be measured by the measuring apparatus 30 respectively via the communication pipes 30a.

In the example illustrated in FIG. 10, the pressure or the concentration of the gas in the sealed spaces S2, S3, S4, and S5 are measured by the measuring apparatus 30. With this, which part of the first seal 12 and the second seal 14 in the transport direction of the boards is damaged can be detected. Specifically, for example, in a case where the measuring apparatus 30 detects abnormalities of the pressure or the concentration of the gas in the sealed space S3, it can be determined that, of parts of the first seal 12 or the second seal 14, ones defining the sealed space S3 have been damaged.

As described above, in the reflow apparatus 100 according to this embodiment, the pressure or the concentration of the gas in the sealed space S1 can be measured after the sealed space S1 has been filled with the inert gas such as nitrogen. Thus, in a case where the pressure or the concentration of the gas in the sealed space S1 reaches a predetermined threshold, it can be grasped that the failures of the gasket 10 have occurred. Further, the sealed space S1 that is defined by the gasket 10 is located to separate the processing chamber 110D and the outside of the furnace, and in addition, can be more easily reduced in volume than the processing chamber 110D. Thus, unlike the related art, leakage of the gas from the sealed space S1 that is narrower than the processing chamber 110D can be detected before occurrence of abnormalities of the concentration of the gas such as oxygen in the processing chamber 110D. As a result, the failures of the gasket 10 can be more promptly detected.

In addition, in the reflow apparatus 100 according to this embodiment, whether or not abnormalities of oxygen concentration in the processing chamber 110D have occurred can be monitored by the measuring apparatus 30 illustrated in FIG. 1, and the failures of the gasket 10 can be monitored by the measuring apparatus 30 illustrated in FIG. 3 and FIG. 10. With this, by monitoring whether or not the failures of the gasket 10 have occurred in a case where the abnormalities of the oxygen concentration in the processing chamber 110D are detected, it can be determined whether or not the abnormalities of the oxygen concentration in the processing chamber 110D are caused by the gasket 10. Thus, if the failures of the gasket 10 have not occurred, it can be determined that the abnormalities of the oxygen concentration in the processing chamber 110D are caused by other factors. Therefore, causes of the abnormalities of the oxygen concentration can be easily specified.

Although the upper furnace body 110A is openable/closable on its one side relative to the lower furnace body 110B in the above-described configuration of the reflow apparatus 100 according to this embodiment, the present invention is not limited to this configuration. For example, the configuration of the present invention is applicable, for example, also to a soldering apparatus as disclosed in PCT Application WO 2018/225437, in which the upper furnace body 110A is opened and closed by being moved upward and downward by raising/lowering means. In addition, the present invention is applicable also to a soldering apparatus including two or more transport conveyors.

The above description of the embodiment of the present invention is made merely for the sake of better understanding of the present invention, and hence is not intended to limit the present invention. As a matter of course, the present invention may be varied and modified within the gist thereof, and may encompass equivalents thereof. In addition, as long as at least some of the above-described problems can be solved, or as long as at least some of the above-described advantages can be obtained, the components described in Claims and described herein may be arbitrarily omitted or combined with each other.

REFERENCE SIGNS LIST

12: first seal
14: seal
30: measuring apparatus
32: gas supply apparatus
42: seal
44: fourth seal
100: reflow apparatus
110: furnace body
110D: processing chamber
140: control apparatus
S1, S2, S3, S4, S5: sealed space

What is claimed is:

1. A soldering apparatus, comprising:
a furnace body including an upper furnace body, a lower furnace body, and a processing chamber in which boards are processed;
a gasket
provided along an edge of the upper furnace body or the lower furnace body,
configured to seal the furnace body,
including a first seal and a second seal spaced apart from the first seal along the edge of the upper furnace body or the lower furnace body,
including a third seal that effects sealing between the first seal and the second seal when the third seal of the gasket is in contact with the other of the upper or lower furnace body and the furnace body is closed, and
including a fourth seal
that effects the sealing between the first seal and the second seal when the third seal of the gasket is in contact with the other of the upper or lower furnace body and the furnace body is closed; and that is arranged away from the third seal;
a sealed space
    isolated from the processing chamber, and
    defined between the first seal and the second seal of the gasket, between the upper furnace body and the lower furnace body, and at least by the furnace body, the first seal, the second seal, the third seal, and the fourth seal when the furnace body is closed;
a gas supply apparatus configured to supply a first gas into the sealed space;
a measuring apparatus configured to measure one of pressure in the sealed space, and concentration of a second gas in the sealed space; and
a control apparatus capable of communicating with the measuring apparatus,
wherein the control apparatus is configured to determine whether the one of the pressure and the concentration received from the measuring apparatus has reached a predetermined threshold.

2. The soldering apparatus according to claim 1, wherein the first gas is nitrogen.

3. The soldering apparatus according to claim 1, wherein the second gas is oxygen.

4. The soldering apparatus according to claim 1,
wherein the third seal is arranged between respective end portions on one side of the first seal and the second seal, and
wherein the fourth seal is arranged between respective end portions on another side of the first seal and the second seal.

5. A soldering apparatus, comprising:
a furnace body including an upper furnace body, a lower furnace body, and a processing chamber in which boards are processed;
a gasket
    provided along an edge of the upper furnace body or the lower furnace body,
    configured to seal the furnace body,
    including a first seal and a second seal spaced apart from the first seal along the edge of the upper furnace body or the lower furnace body,
    including a third seal that effects sealing between the first seal and the second seal when the third seal of the gasket is in contact with the other of the upper or lower furnace body and the furnace body is closed, and
    including a fourth seal
        that effects the sealing between the first seal and the second seal when the third seal of the gasket is in contact with the other of the upper or lower furnace body and the furnace body is closed; and
        that is arranged away from the third seal;
a sealed space
    isolated from the processing chamber, and
    defined between the first seal and the second seal of the gasket, between the upper furnace body and the lower furnace body, and at least by the furnace body, the first seal, the second seal, the third seal, and the fourth seal when the furnace body is closed;
a gas supply apparatus configured to supply a first gas into the sealed space;
a measuring apparatus configured to measure a concentration of the first gas in the sealed space; and
a control apparatus capable of communicating with the measuring apparatus,
wherein the control apparatus is configured to determine whether the concentration received from the measuring apparatus has reached a predetermined threshold.

6. The soldering apparatus according to claim 1,
wherein the measuring apparatus is configured to transmit measurement data obtained by measuring the one of the pressure and the concentration to the control apparatus.

7. The soldering apparatus according to claim 1,
wherein the gasket extends in a longitudinal direction along the edge of the upper furnace body or the lower furnace body, and
wherein the first seal and the second seal extend in the longitudinal direction along the edge of the upper furnace body or the lower furnace body, with the second seal being spaced apart from the first seal in a transverse direction perpendicular to the longitudinal direction along the edge of the upper furnace body or the lower furnace body.

8. A soldering apparatus, comprising:
a furnace body including an upper furnace body and a lower furnace body that together define a processing chamber when the furnace body is closed;
a gasket extending in a longitudinal direction along at least one edge of the upper furnace body or the lower furnace body, the gasket being configured to form a seal between the upper furnace body and the lower furnace body when the furnace body is closed that prevents gas leakage from the processing chamber to an outside of the furnace body, the gasket including:
a first seal and a second seal spaced apart from the first seal in a transverse direction perpendicular to the longitudinal direction, the first seal and the second seal extending in the longitudinal direction along the at least one edge of the upper furnace body or the lower furnace body, and
a fixation portion coupled to the first seal and the second seal, the fixation portion extending in the longitudinal direction along the at least one edge of the upper furnace body or the lower furnace body and extending in a transverse direction between the first seal and the second seal,
wherein, when the furnace body is closed, a first sealing surface of the first seal and a second sealing surface of the second seal respectively contact discrete portions of the upper furnace body or the lower furnace body,
wherein, when the furnace body is closed, the first seal, the second seal, the fixation portion, and the furnace body together define a sealed space between the upper furnace body and the lower furnace body that is isolated from the processing chamber and from the outside of the furnace body;
a gas supply apparatus configured to supply a first gas to the sealed space; and
a measuring apparatus configured to measure one of pressure in the sealed space or a concentration of a second gas in the sealed space.

9. The soldering apparatus according to claim 8, wherein the first seal, the second seal, and the fixation portion are of integral construction.

10. The soldering apparatus according to claim 9, wherein the first seal and the second seal have substantially the same thickness, wherein the fixation portion is thinner than each of the first seal and the second seal, and wherein, when the furnace body is closed, substantially uniform pressure is applied to the first sealing surface of the first seal and the second sealing surface of the second seal.

11. The soldering apparatus according to claim 8, further comprising:
a control apparatus communicably connected to the measuring apparatus,
wherein the measuring apparatus is configured to transmit measurement data obtained by measuring the pressure in the sealed space or the concentration of the second gas in the sealed space to the control apparatus, and
wherein the control apparatus is configured to determine whether the one of the pressure in the sealed space or the concentration of the second gas in the sealed space has reached a predetermined threshold.

12. The soldering apparatus according to claim 8, wherein the gasket further includes:
a third seal coupled to the first seal and the second seal and extending in a transverse direction between the first seal and the second seal,
wherein, when the furnace body is closed, the first seal, the second seal, and the third seal together define a first sealed space and a second sealed spaced disposed between the upper furnace body and the lower furnace body that are isolated from each other and from the processing chamber and the outside of the furnace body,
wherein the gas supply apparatus is configured to supply the first gas to the first sealed space and to the second sealed space,
wherein the measuring apparatus is configured to measure one of pressure in the first sealed space and a concentration of the second gas in the first sealed space, and
wherein the measuring apparatus is configured to measure one of pressure in the second sealed space and a concentration of the second gas in the second sealed space.

13. A soldering apparatus, comprising:
a furnace body including an upper furnace body and a lower furnace body that together define a processing chamber when the furnace body is closed;
a gasket
extending in a longitudinal direction along an edge of the upper furnace body or the lower furnace body,
configured to form a seal between the upper furnace body and the lower furnace body when the furnace body is closed,
including a first seal and a second seal spaced apart from the first seal in a transverse direction perpendicular to the longitudinal direction along the edge of the upper furnace body or the lower furnace body, and
including a fixation portion coupled to the first seal and the second seal, the fixation portion extending in the longitudinal direction along the edge of the upper furnace body or the lower furnace body and extending in a transverse direction between the first seal and the second seal;
a sealed space
isolated from the processing chamber, and
defined between the upper furnace body and the lower furnace body and by the first seal, the second seal, the fixation portion, and the furnace body when the furnace body is closed;
a gas supply apparatus configured to supply a first gas into the sealed space;
a measuring apparatus configured to measure one of pressure in the sealed space, and
concentration of a second gas in the sealed space; and
a control apparatus capable of communicating with the measuring apparatus,
wherein the control apparatus is configured to determine whether the one of the pressure and the concentration received from the measuring apparatus has reached a predetermined threshold.

14. A soldering apparatus, comprising:
a furnace body including an upper furnace body and a lower furnace body that together define a processing chamber when the furnace body is closed;
a gasket
extending in a longitudinal direction along an edge of the upper furnace body or the lower furnace body,
configured to form a seal between the upper furnace body and the lower furnace body when the furnace body is closed,
including a first seal and a second seal spaced apart from the first seal in a transverse direction perpendicular to the longitudinal direction along the edge of the upper furnace body or the lower furnace body, and
including a fixation portion coupled to the first seal and the second seal, the fixation portion extending in the longitudinal direction along the edge of the upper furnace body or the lower furnace body and extending in a transverse direction between the first seal and the second seal;
a sealed space
isolated from the processing chamber, and
defined between the upper furnace body and the lower furnace body and by the first seal, the second seal, the fixation portion, and the furnace body when the furnace body is closed;
a gas supply apparatus configured to supply a first gas into the sealed space;
a measuring apparatus configured to measure a concentration of the first gas in the sealed space; and
a control apparatus capable of communicating with the measuring apparatus,
wherein the control apparatus is configured to determine whether the concentration received from the measuring apparatus has reached a predetermined threshold.

* * * * *